(12) United States Patent
Sullivan et al.

(10) Patent No.: US 6,217,720 B1
(45) Date of Patent: *Apr. 17, 2001

(54) MULTI-LAYER REACTIVE SPUTTERING METHOD WITH REDUCED STABILIZATION TIME

(75) Inventors: Brian T. Sullivan, Gloucester; Jerzy A. Dobrowolski; Glenn A. Clarke, both of Ottawa, all of (CA); Takayuki Akiyama, Kanagawa; Takashi Ito, Tokyo, both of (JP)

(73) Assignee: National Research Council of Canada, Ottawa (CA)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/867,789

(22) Filed: Jun. 3, 1997

(51) Int. Cl.[7] .................................................. C23C 14/34
(52) U.S. Cl. ................................ 204/192.13; 204/192.26
(58) Field of Search .......................... 204/192.12, 192.15, 204/298.12, 298.13, 298.23, 298.26, 298.28, 192.11, 192.13, 298.03, 192.26, 192.23, 192.24

(56) References Cited

U.S. PATENT DOCUMENTS

| | | | |
|---|---|---|---|
| 4,065,600 | * 12/1977 | King et al. | 204/192.26 |
| 4,166,783 | * 9/1979 | Turner | 204/192.13 |
| 4,311,725 | * 1/1982 | Holland | 204/192.13 |
| 4,407,709 | * 10/1983 | Enjouji et al. | 204/192.13 |
| 5,126,028 | * 6/1992 | Hurwitt et al. | 204/192.13 |
| 5,169,509 | * 12/1992 | Latz et al. | 204/298.08 |
| 5,292,417 | * 3/1994 | Kugler | 204/298.08 |
| 5,354,575 | * 10/1994 | Dagenais et al. | 204/192.13 |
| 5,423,970 | * 6/1995 | Kugler | 204/298.08 |
| 5,525,199 | * 6/1996 | Scobey | 204/192.26 |
| 5,556,520 | * 9/1996 | Latz | 204/298.08 |
| 5,579,162 | * 11/1996 | Bjornard et al. | 204/192.26 |
| 5,607,559 | * 3/1997 | Yamada et al. | 204/192.13 |
| 5,618,575 | * 4/1997 | Peter | 204/192.13 |
| 5,665,214 | * 9/1997 | Iturralde | 204/192.13 |
| 5,772,861 | * 7/1998 | Meredith, Jr. et al. | 204/298.03 |

OTHER PUBLICATIONS

Sullivan et al, La Physique au Canada, "Integrated Design and Manufacture of Thin . . .", pp. 213–215, Sep./Oct. 1996.

Sullivan et al, "Manfacture of Complex Optical Multilayer Filters Using an Automated . . .", 10 pgs., 1997.

Sullivan et al, Applied Optics, "Metal/dielectric transmission interference . . .", vol. 34, No. 25, pp. 5684–5694, Sep. 1, 1995.

Sullivan et al, Applied Optics, "Deposition error compensation For optical . . .", vol. 32, No. 13, pp. 2351–2360, May 1, 1993.

* cited by examiner

Primary Examiner—Nam Nguyen
Assistant Examiner—Gregg Cantelmo
(74) Attorney, Agent, or Firm—Jacobson, Price, Holman & Stern, PLLC

(57) ABSTRACT

A method is described for depositing a complex optical multilayer coating on a substrate. The coating consists of multiple layers of at least two material types. The layers are sequentially deposited in a deposition chamber by reactive deposition; preferably sputtering, and the thickness of the deposited layers is determined one or more times during the layer deposition by taking optical measurements of the deposited layer and fitting theoretical values derived from a model of the deposited layers to the corresponding actual values obtained from said measurements. A process variable is continually controlled to ensure homogeneity of the deposited layers so that a valid thickness determination can be made from said theoretical model.

6 Claims, 12 Drawing Sheets

MULTI-LAYER REACTIVE SPUTTERING METHOD WITH REDUCED STABILIZATION TIME

FIELD OF THE INVENTION

This invention relates to a method and apparatus for depositing complex optical multilayer coatings onto a substrate.

BACKGROUND OF THE INVENTION

In a number of different fields such as telecommunications, scientific instrumentation, optics and so forth, there is a need for more complex optical thin film coatings to meet the requirements of advanced applications. In the past, due to limitations in design techniques, deposition equipment and thickness monitoring instrumentation, it has not always been possible to achieve the desired filter specifications. However, recent advances in all three of these areas have allowed more complex coatings to be designed and fabricated.

For example, in the area of optical thin film design there have been some dramatic improvements over the past few years in the ability to design coatings without any starting design for a given set of materials. Indeed, state of the art of thin film design has advanced to the point where very complex coatings can be found that meet all but the most stringent filter specifications.

The second advance is in energetic deposition methods, which have dramatically changed the field of thin film manufacture over the past twenty years. Previously, and still true to a large extent, most optical coatings have been fabricated using e-beam evaporation or thermal evaporation. However, materials deposited by these processes are generally quite porous, resulting in filters with poor humidity and temperature stability unless they are specially protected. Newer energetic deposition processes, such as ion-assisted evaporation, reactive ion-plating and magnetron sputtering give rise to films that have bulk-like properties which results in filters with good-to-excellent temperature and humidity stability. More importantly perhaps, materials deposited by these energetic techniques have optical constants that are very reproducible from run-to-run. With bulk-like materials and optical constant reproducibility, it becomes more feasible to manufacture complex optical coatings on a routine basis.

The third advance has been in methods used to control or monitor the film thickness during deposition. In particular, optical monitoring techniques have greatly improved over the past ten years. Sophisticated and inexpensive wideband monitors for the visible region are now readily available and infrared photodiode arrays are becoming more common. With these wideband monitors, it is now possible to more accurately determine the thickness of a deposited layer.

In the past, for limited filter quantities, it may not have been economical to design and fabricate small quantities of complex thin film filters even though there is a large market for such custom or prototype coatings. Part of the reason for this is the time it takes to design a coating and the number of trial deposition runs that usually have to be made before a filter is successfully fabricated. If, in addition, the deposition system requires constant operator intervention to ensure the coating is accurately deposited, the cost will be further increased.

In 1991 a project was begun at the National Research Council of Canada (NRCC) to develop an Automated Deposition System (ADS) that could routinely fabricate complex optical coatings automatically without the need for operator intervention during the deposition process.

The original rf-ADS at the NRCC consisted of a cryo-pumped chamber having a rotatable substrate; three rf-sputtering targets; and a wideband optical monitor that will be described in more detail below. The targets and chamber were designed and built by Corona Vacuum Coaters. In the ADS, the sputtering targets and substrates are mounted vertically. The targets are usually metal or semiconductor, so that the system uses rf reactive sputtering for dielectric layers. Typical deposition rates for materials like $Nb_2O_5$ and $SiO_2$ using rf sputtering are ~0.1 nm/s for a target-to-substrate distance of ~12 cm, a total pressure of ~3 mTorr and an oxygen-to-argon flow ratio of ~1.0. The substrate is controlled by a stepper motor that can be used to swing the substrate to the various target positions. The deposition system was controlled by a Techware Systems (known as Brooks Automation (Canada)) PAL68000 controller. An operator can automatically initiate a number of different sequences including pumping down the chamber, starting a deposition run or venting the chamber.

A real-time process control algorithm accurately controls the film deposition thickness for low rate deposition, i.e. deposition rates of the order of 0.1 nm/s. This technique requires a wideband optical monitor that is able to make accurate, absolute, transmittance measurements over a sufficiently wide spectral range. Also, because it is difficult to continuously monitor the deposition of a layer in sputter systems where the target-to-substrate distance is small, this method relies on making one or two transmittance measurements near the end of a layer deposition.

The optical monitor consists of a quartz-halogen lamp source, light delivery optics, and a wideband detector. The collimated light from the source passes through the chamber and is collected by an achromatic lens that focuses the light through a shutter onto the circular aperture of a fiber-optic bundle. At the other end of the bundle, the fibers are arranged to form a slit at the entrance to a monochromator. The light is then dispersed onto a 512-element Hamamatsu photodiode array. The grating was chosen such that optical monitor could measure over a 380 to 860 nm spectral range. In order to make absolute transmittance measurements, it is possible to rotate the substrate in and out of the optical monitor light path. This allows intensity measurements to be made with and without the substrate. These measurements, after subtracting the background, are then normalized to provide the absolute transmittance of the substrate. This measurement process is completely automated.

The last key element in the ADS system is an integrated thin film program that can be used to first design complex multilayer coatings, based on the optical constants of the materials deposited by the ADS, and then can be subsequently used to oversee the manufacture of the coating. This program can determine the current or previous layer thicknesses from the absolute transmittance measurements of the optical monitor. In addition, the program can reoptimize the remaining layers in the multilayer system at any time during deposition in order to achieve the desired filter specifications.

The program is integrated with the deposition controller in such a way that it does not need to know any details concerning the actual deposition system. When it requires a particular layer to be deposited, it is sufficient to pass down the layer material, the desired thickness and a process name. The controller software then interprets this information to determine the target that the substrate should be rotated to; the length of time the substrate should remain in front of the target; and the deposition parameters that should be used during the deposition. By separating the thin film control algorithm and the deposition system in this way, it is possible to completely change the deposition system and processes without affecting the thin film program.

For a given layer during deposition, the thickness process control algorithm essentially has three stages:

I. termination of layer deposition,

II. determination of layer thickness deposited, and

III. reoptimization of remaining layer thicknesses.

With the ADS, stages I and II are combined together. The first stage, concerned with the termination of a layer deposition, can be based on time alone since sputter deposition is being used in this system. Since the uncertainties in the deposition are typically of the order of 1–3%, for a reasonably well-controlled process, this implies that in order not to overshoot the desired layer thickness, the target thickness first specified should be around 95–97% of the desired thickness. Once this sub-layer has been deposited it is then necessary to determine the layer thickness actually deposited, i.e., stage II. As described above, this is achieved by performing a wide-band optical monitor measurement directly on the substrate of interest, or on a witness slide. The thin film program then uses this information to determine the current layer thickness deposited. If the layer thickness is not within the specified thickness tolerance with respect to the desired thickness, stages I and II can be repeated. Since the remaining layer thickness is typically quite small, i.e., less than 5 nm or so, any uncertainties in the deposition rate are not very important for the second sub-layer. The determined layer thickness is also sent back to the controller which uses this information to update the current deposition rates in order to minimize the number of sub-layers required. The final stage concerns the reoptimization of the remaining layer thickness once the layer has been finished. For some filters, this stage is not necessary, however for other filters this reoptimization is critical if the desired filter specifications are to be met.

Crucial to fabricating a filter with a good performance in the ADS is the assumption that the deposited filter can be accurately modeled. This then allows an accurate determination of the layer thickness based on the experimental transmittance data. If this is not achieved, then it will not be possible to accurately control the fabrication of the multilayer. Fortunately, once the optical constants of the materials have been well characterized, any problems with the layer determination can usually be handled by modifying the layer determination process or by adjusting the multilayer solution. Using the thin film program, it is possible to first simulate the deposition process in the ADS before making a coating and to see if the layer determination strategy is acceptable.

In setting up the layer determination process, a number of factors need to be considered that depend on the nature of the filter that is being fabricated. For instance, a minimum layer thickness is required so that there is a detectable change in the transmittance of the filter after it has been deposited. If a multilayer has been fabricated and the resulting filter performance is not within specifications, it is possible to enter a replay mode since all the transmittance measurements made during a deposition run are saved. With this feature, an operator can quickly review the multilayer deposition and pin-point where the problem layers were. It is then possible to re-adjust some layer determination parameters in the replay mode to see if a better solution can be obtained. For example, an accurate determination of the thickness of a given layer may be hard to achieve depending on the multilayer system. In this case, it may be best to deposit that current layer by time alone and use transmittance measurements after the next layer has been deposited to accurately determine the thickness of both layers. Reoptimization of the remaining layers can then be used to take into account any thickness errors in these layers.

Many different types of filters have been fabricated on the rf-ADS over the past several years. These include all-dielectric coatings such as edge filters, narrowband transmittance filters, notch filters, colorimetric filters, antireflection filters, custom bandpass filters as well as metal/dielectric coatings.

The rf-ADS has proved capable of fabricating complex optical filters automatically. However, there are some limitations to this system that preclude its use as a production deposition system; namely, the low deposition rates and the somewhat limited thickness uniformity. Some filter designs can take up to 21 hours to deposit. Hence, it would be very beneficial to be able to greatly increase the deposition rates while at the same time also increasing the thickness uniformity.

High rate sputter sources capable of depositing films at rates of the order of 0.7 nm/s have recently become available. Unfortunately, when such sources were employed, it was found that the film thicknesses could not be determined with the required degree of accuracy. As a result, the ADS system, which works well at low rates, could not be used to deposit complex films automatically at commercially viable rates.

An object of the invention is to provide an automated deposition system capable of operating at relatively high rates.

SUMMARY OF THE INVENTION

Accordingly, one aspect of the invention provides a method of depositing a complex multilayer coating on a substrate, said coating consisting of multiple layers of at least two material types, said method comprising the steps of sequentially depositing said layers in a deposition chamber by high rate, reactive deposition; determining the thicknesses of the deposited layers at one or more times during the layer deposition by taking optical measurements of the deposited layer and fitting theoretical values derived from a model of the deposited layers to the corresponding actual values obtained from said measurements; and continually controlling a process variable to ensure homogeneity of the deposited layers so that a valid thickness determination can be made from said theoretical model.

The optical quality measured can be, for example, the transmittance, reflectance or ellipsometric value of the multilayer coating at one or more wavelengths. The theoretical values can be obtained by adjusting one or more layer thicknesses of the deposited layers in the theoretical model in order to fit the calculated data of the model to the measured data.

In order to increase the deposition rates, dual ac-magnetron sources are employed. These sources enable high rates of the order of 0.7 nm/s to be attained. In this specification, high rates generally refer to deposition rates in the order of 0.5 nm/s and above, and low rates refer to deposition rates of the order of 0.1 nm/s. However, as noted above when high rate sources are used, it is found that the thickness of the deposited layer could not be determined accurately.

The applicants have discovered that this is due to the inhomogeneous nature of films deposited when high rate sources are employed resulting from the loss of stochiometry due to the poor control of the process variables when the deposition power is changed. For example, in the case of reactive sputter deposition of $Nb_2O_5$, the layer is normally deposited by bombarding a niobium (Nb) target in the sputtering chamber in the presence of oxygen and argon. Nb and O atoms are then ejected from the target surface and then combine on the surface of the substrate to form $Nb_2O_5$. In addition, oxygen atoms from the plasma interact with the growing film on the substrate surface. The oxygen is also gettered by superfluous niobium deposited on the walls of the chamber. If the power applied to the Nb target is changed, then this changes the deposition rate of the Nb atoms, which can then greatly affect the gettering of the oxygen. This then results in a lower or higher oxygen partial pressure in the chamber if the oxygen flow rate is held constant. If the deposition power is changed and if the oxygen flow is not rapidly adjusted to maintain a constant oxygen partial pressure, then the stoichiometry of the growing film will be affected. While at low powers, the flow rate adjustment can be adjusted sufficiently rapidly, this is not true at high powers. This causes inhomogeneities in the deposited film in the thickness direction. These inhomogeneities affect the ADS thickness determination algorithm since it assumes homogeneous films are being deposited.

In a preferred embodiment, homogeneity of the film is achieved by varying a flow rate of the reactive gas, typically oxygen, so as to maintain a constant partial pressure of that gas.

It is also preferred to deposit the layer initially at a high rate and determine the thickness from transmittance measurements by comparing the measured transmittance with the transmittance calculated on the assumption that the layers are homogeneous. Any remaining thickness is then deposited at a low rate. Typically 95–97% of the desired layer thickness is deposited at the high rate. If the thickness measurement shows that appropriate thickness has been exceeded, compensating adjustments can be made to the remaining layers.

In a further aspect the invention provides a method of depositing a complex multilayer coating on a substrate, said coating consisting of multiple layers of at least two material types, said method comprising the steps of sequentially depositing said layers in a reactive deposition chamber permitting variable power settings while monitoring the deposition process and controlling at least one process variable in real time to provide each layer with desired characteristics; and setting said at least one process variable at the start of the deposition of each layer except the first layer of its material type to match the value of that process variable at the end of the last stage of deposition of the previous layer of the same material type at the same power setting.

The process variable referred to above is typically the flow rate of reactive gas, for example oxygen.

The invention still further provides an apparatus for depositing a complex multilayer coating on a substrate, said coating consisting of multiple layers of at least two material types, said apparatus comprising:

a deposition chamber comprising at least two sources of materials to be deposited by reactive deposition;

means in said chamber for measuring an optical property of the deposited layers;

means for fitting theoretical values derived from a model of the deposited layers to the corresponding actual values obtained from the measurement of said optical property; and means for continually controlling a process variable to ensure homogeneity of the deposited layers so that a valid thickness determination can be made from said theoretical model.

DESCRIPTION OF THE DRAWINGS

The invention will now be described in more detail, by way of example only, with reference to the accompanying drawings, in which.

DETAILED DESCRIPTION OF THE INVENTION

Figure 1:
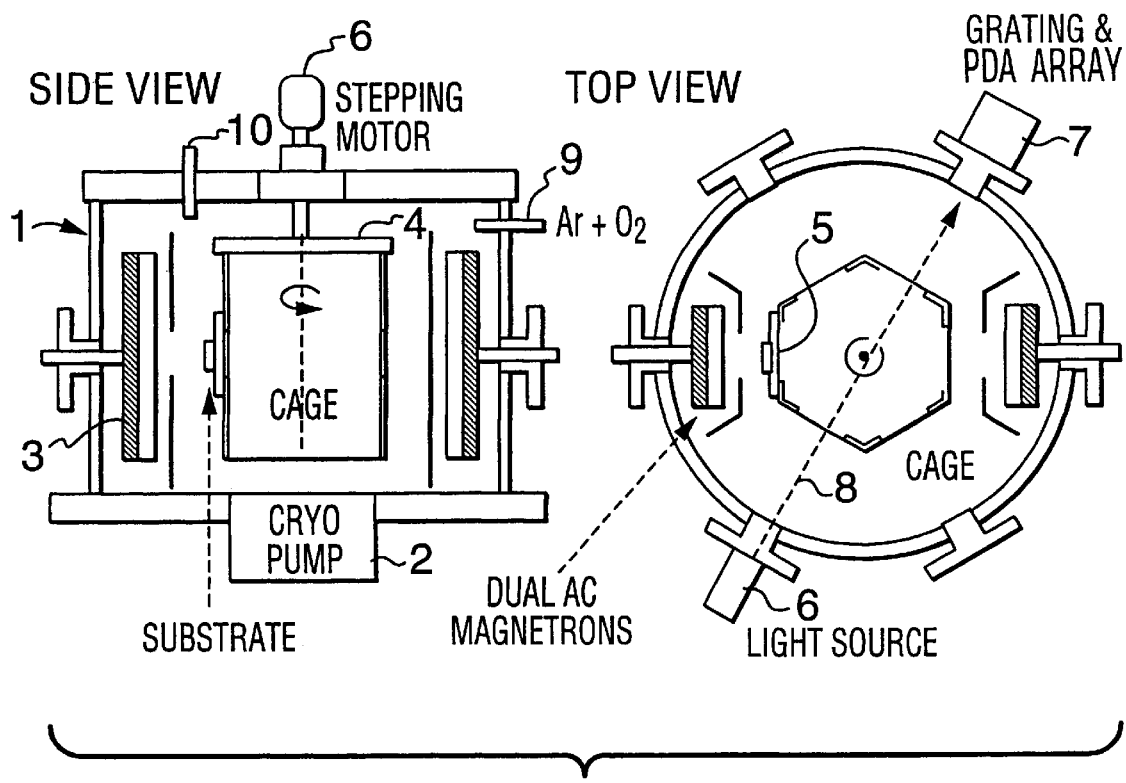
FIG. 1 is a schematic diagram of a sputtering system capable of high rate deposition.

As shown in FIG. 1, the cylindrical sputtering chamber comprises a vacuum chamber 1 with a cryopump 2, two sputter sources 3, and a cage 4 supporting substrates 5. The cage 4 can be rotated about a vertical axis with stepping motor 6.

The substrates 5 can be positioned in front of one of two vertical, metallic or semiconductor targets. To obtain oxide layers, the magnetron sources are operated in a chamber filled with a suitable mixture of Ar and $O_2$ gases.

The chamber also has a light source 6 opposite which is a grating and PDA (Photodiode Array) 7 to permit light transmittance measurements to be made by rotating the cage so that the substrate lies in the light beam 8. The optical monitoring system is capable of measuring the transmittance of the substrates 5 in the 400 to 800 nm spectral region. An inlet 9 admits an argon and oxygen mixture and pressure sensor 10 measures the total pressure in the chamber, which normally is about 3 mTorr.

The sputter sources 3 consist of two dual AC magnetron sources, (~8×40 cm), connected to 40 kHz, 10 kW Advanced Energy power supplies. The two dual AC-magnetron sources and chamber are manufactured by Shincron Co. Ltd., Tokyo, Japan. The system is controlled by a process control computer 12 (FIG. 2), which may be a Techware II+ controller manufactured by Brooks Automation (Canada). Another computer 13 runs a program with a real-time process control algorithm for the deposition of complex multilayer systems. The optical monitor is a Hamamatsu PMA-50 optical monitor.

Figure 2:
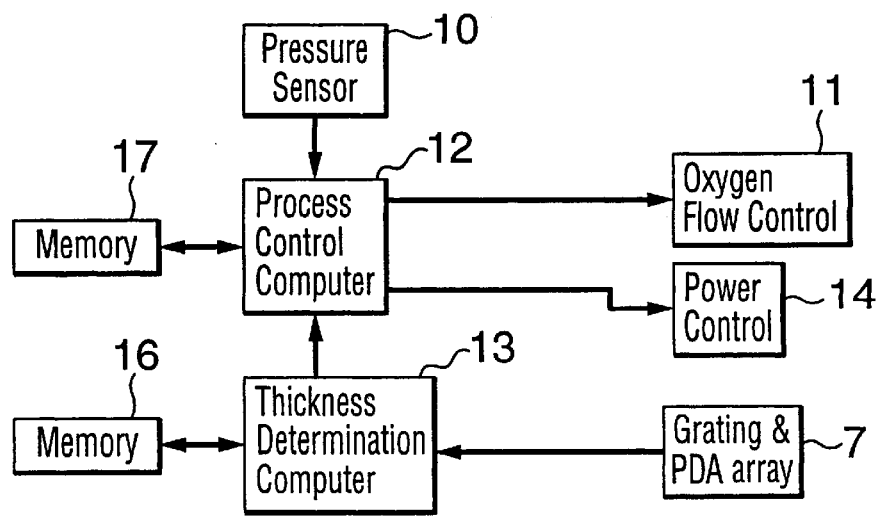
FIG. 2 is a block diagram of the control system.

The basic control system is shown in FIG. 2. This system uses two computers 12, 13, one for the process control and the other for the thickness determination process, although it will be understood by one skilled in the art that a common computer could be used for both processes. Each computer is associated with respective memory 16, 17.

The computer 12 receives input inter alia from the thickness determination computer 13 and the pressure sensor 10, which measures the total pressure in the chamber. This is proportional to the oxygen partial pressure because the argon content does not significantly change. The computer 12 maintains the oxygen partial pressure constant by varying the oxygen flow rate with control unit 11. The computer 12 controls the deposition rate by controlling the power level applied to the sputter sources 3 (FIG. 1) with power control unit 14.

Prior to the start of deposition, the desired filter design can be downloaded to the computer 13. A substrate is then loaded into the deposition chamber and the ADS is then automatically pumped down and then it waits either for a pre-selected time or for when an acceptable base pressure has been reached. At this point, a plasma is ignited in the chamber and the sputtering targets are pre-cleaned. When the deposition system is ready, the controller requests information concerning the first layer from the thin film program.

Figure 3:
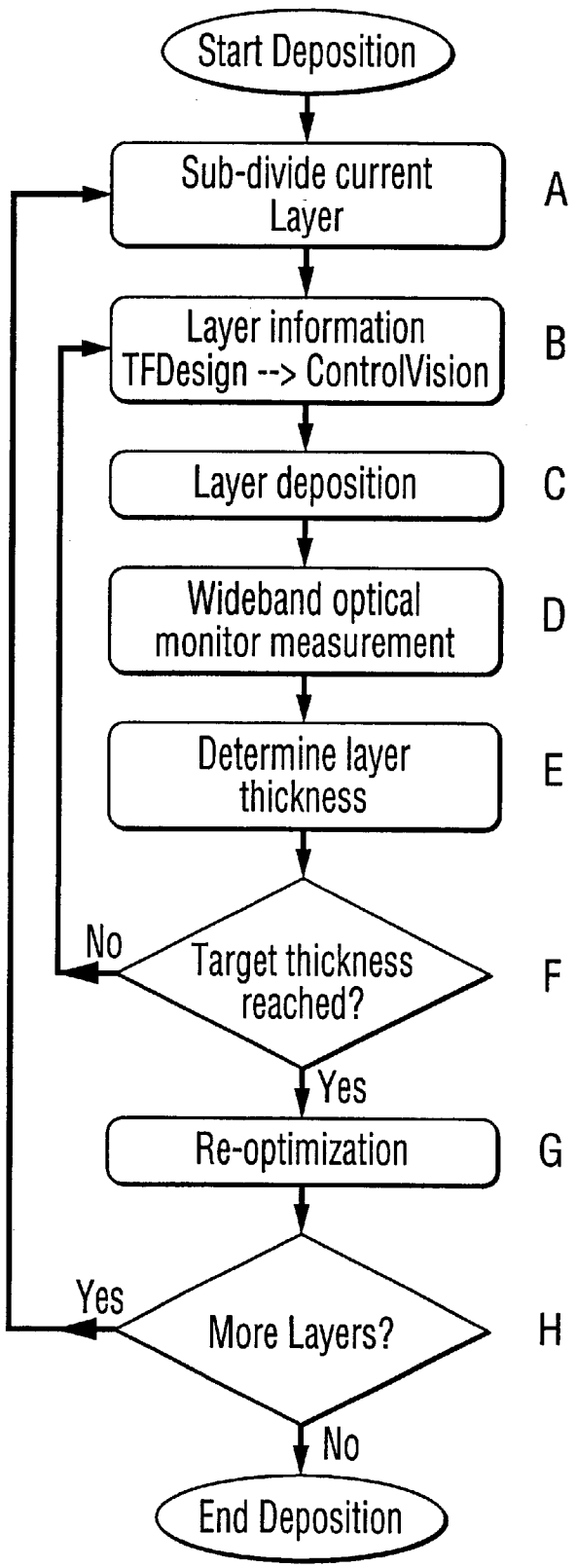
FIG. 3 is a flow chart showing a process control system that can be applied to the invention.

As shown in FIG. 3, the program first subdivides the current layer and then it sends the material name of the current layer along with the desired thickness and the process name for the layer (B). The controller than calculates the sputtering time required for the deposition of the specified layer thickness and rotates the substrate to the appropriate target for the desired time after modifying the deposition parameters. After the layer is deposited at a high rate, typically 0.7 nm/s, the controller notifies the thin film program, which then initiates a wideband optical monitor transmittance measurement of the substrate over the 380 to 860 nm spectral region (D).

The thin film program uses this data to determine the actual layer thickness deposited (E) by finding the best fit with calculated transmittance data. This is achieved by adjusting the layer thickness in the theoretical model until the best match with the measured data is obtained.

If not enough thickness has been deposited (F), the steps (B) to (E) are repeated at a low rate, typically 0.1 nm/s until the thickness is within a specified tolerance of the desired thickness. If too much thickness has been deposited or if the predicted filter performance is not acceptable anymore, the thicknesses of the remaining layers can be reoptimized (G) before the next layer is deposited (H). This process is repeated until all the layers have been deposited. Quite often no reoptimization is required during the deposition since the layer thickness control is accurate to within 1 nm or better.

In reactive sputtering the reactive gas (such as oxygen or nitrogen) is introduced into the deposition chamber 1 (FIG. 1) along with the argon. When the gas flow is sufficiently high, a dielectric (insulating) layer will form on the target surface. This process is known as a poisoned target mode sputtering and it usually produces the best quality films with little or no absorption. The positive Ar ions sputter off both metal and oxygen atoms that subsequently coat the substrate. In addition, atomic oxygen present in the plasma will also react with the growing dielectric film on the substrate. When a dc voltage is applied to the target, the dielectric layer will soon charge up and the plasma will be extinguished and the sputtering will stop. To avoid this, a rf or ac voltage is applied to the target. This allows a negative bias voltage to be maintained on the target and keeps the sputtering process going.

Figure 4:
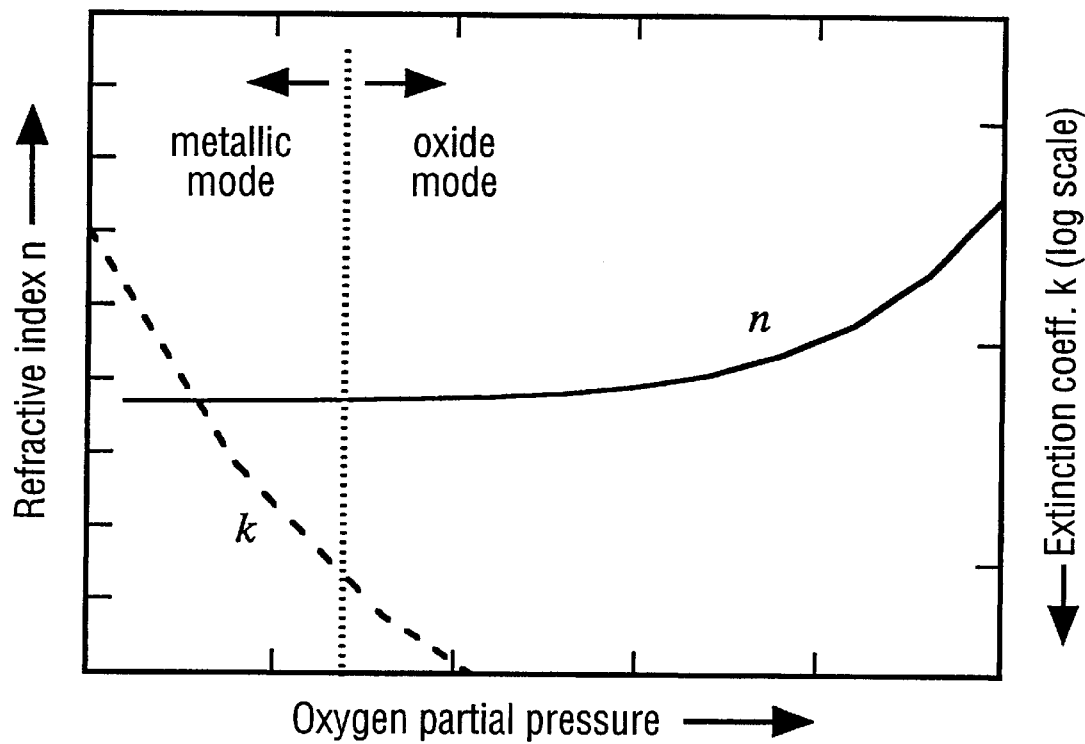
FIG. 4 shows the variation in refractive index as a function of oxygen partial pressure for a $Nb_2O_5$ layer.

It is important that dielectric films produced by reactive magnetron sputtering have the correct composition (stoichiometry). Consider the deposition of an oxide layer from a metallic target with oxygen (reactive) gas in the chamber. It has been found experimentally that the refractive index of the film can change if there is too much or too little oxygen in the chamber. A lack of stoichiometry can also lead to an increase in the absorption of the film. For instance, there is an oxygen partial pressure below which sputtering takes place in an uncovered metal mode resulting in near-metallic films (see FIG. 4). Above this oxygen partial pressure the target surface is partially or fully oxidized resulting in oxide films with little or no absorption. For this reason, the operating oxygen partial pressure is usually chosen to be at a safe value above this transition oxygen partial pressure.

Suppose that during a reactive sputtering process the argon flow is constant and the oxygen flow is adjusted to maintain a constant total pressure of argon and oxygen in the chamber. Let now a sufficiently high power be applied to the magnetron target so that sputtering takes place. The metal that is deposited on the substrates and on the walls of the chamber will react with the oxygen gas in the chamber to form a compound. As a result, at first the amount of free oxygen in the chamber will be reduced. (This process, which acts like a selective pump for oxygen, is known as "gettering".) However, since the process strives to maintain a constant total pressure of argon and oxygen while keeping the flow of argon constant, the flow of oxygen will be increased. In time a steady state will again be re-established. The time required to attain this steady state will depend on the amount of power applied to the magnetron and the parameters controlling the oxygen flow.

Figure 5:
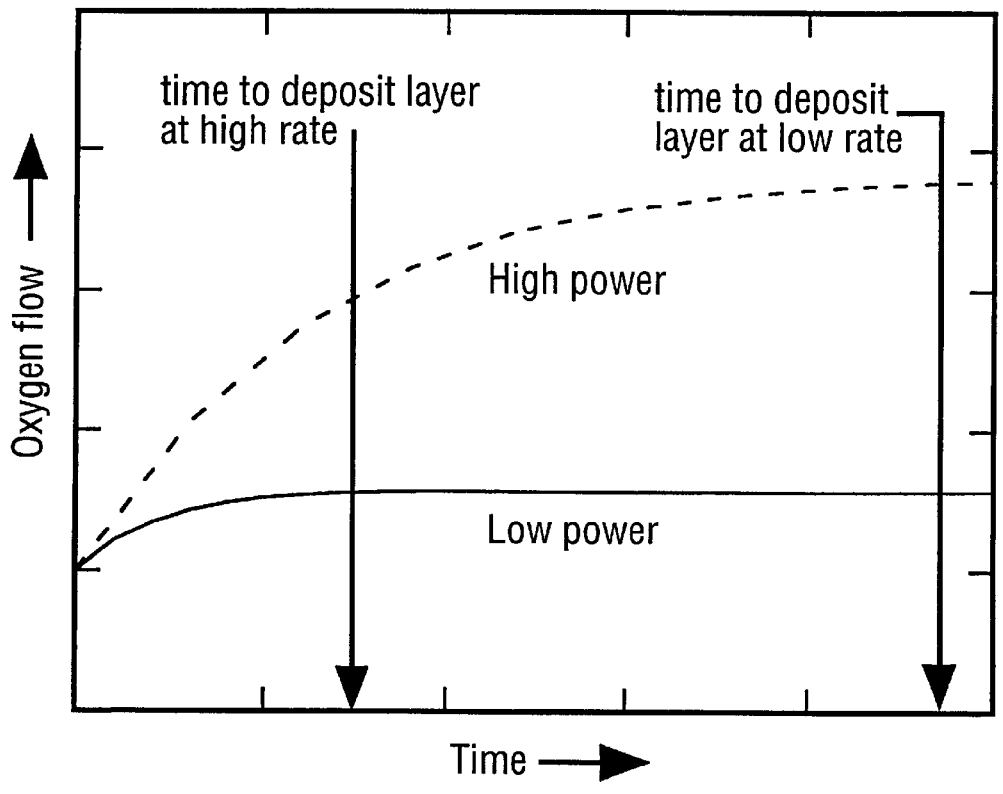
FIG. 5 is a schematic representation of the oxygen flow as a function of time for low and high rate deposition.
Figure 6:
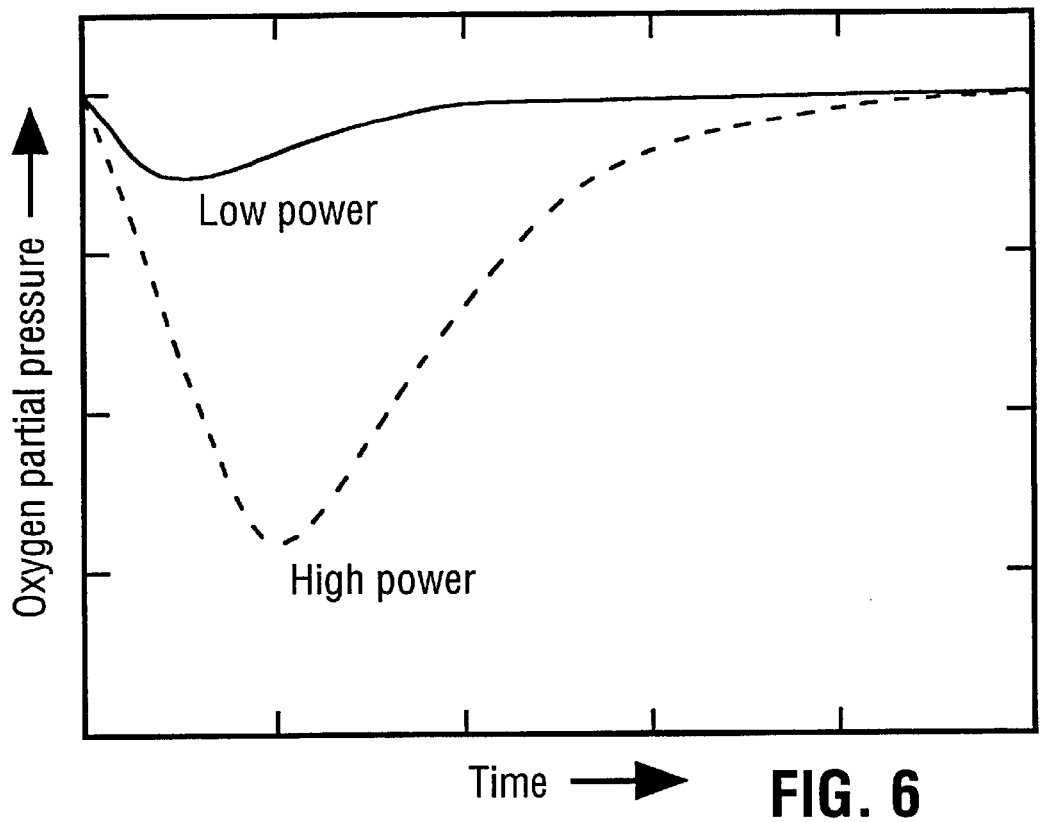
FIG. 6 shows the shows the oxygen partial pressure as a function of time after low or high power is applied to a magnetron source.
Figure 7:
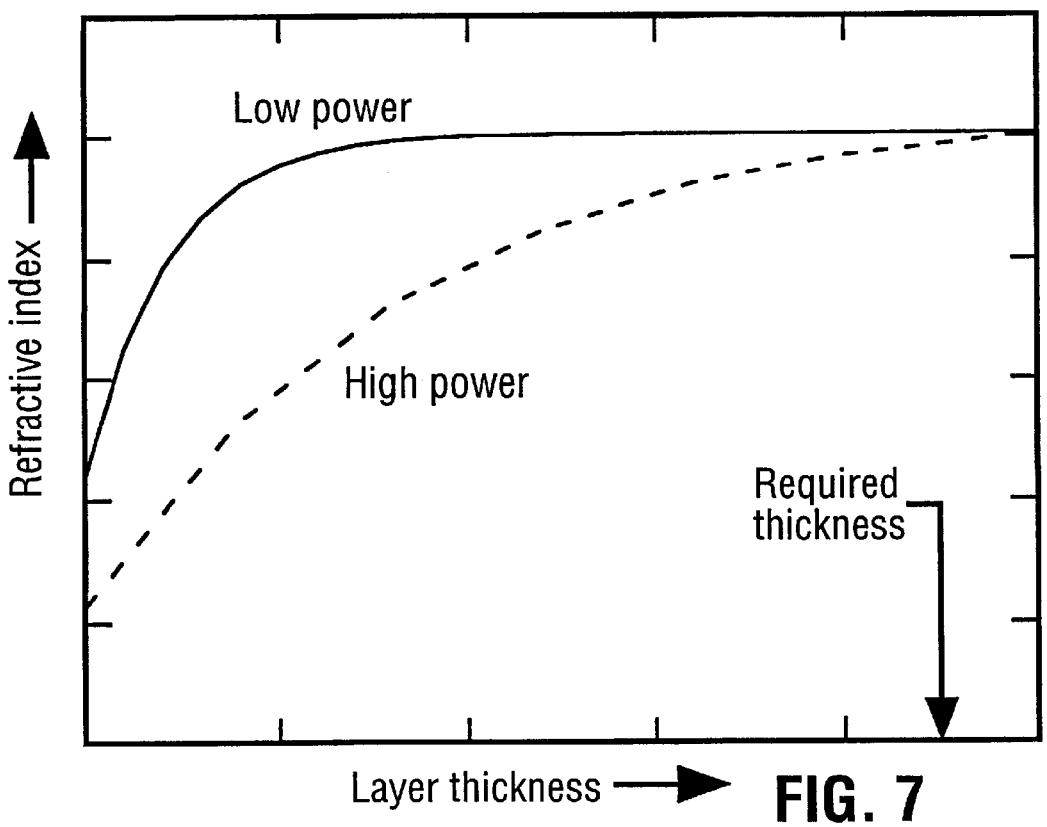
FIG. 7 is a schematic diagram showing the inhomogeneity in the refractive index of layers deposited with high and low powers.

It will be seen from the schematic diagram of FIG. 5 that for low powers the change in the oxygen flow rate is small, the recovery is rapid and the oxygen flow is relatively steady during the time required for the deposition of a thin film. During high power sputtering the gettering is much greater and the time required to deposit a given film thickness is much shorter compared to low rate deposition. Consequently the oxygen flow rate will vary markedly throughout the formation of the layer. Changes in the oxygen flow rate translate into variations in the oxygen partial pressure (FIG. 6). This results in a variation of refractive index within the layer. The schematic diagram in FIG. 7 indicates that the refractive index will be constant over most of the film deposited at a low rate. However, at high rates, using this gas control strategy, the refractive index of the coating will vary throughout the coating. Changes in the oxygen partial pressure in the chamber can also significantly affect the film quality through gas scattering. This has an effect on the microstructure of the film and hence, once again, on its refractive index. These effects are not very important for low rate deposition of layers, but may lead to severe problems due to refractive index inhomogeneities in high rate deposition.

At low rates a constant total gas pressure and a constant flow of argon can be maintained while assigning the same initial (fixed) oxygen gas flow for the deposition of each layer of the same material. At the time when the power is changed, to avoid any absorption in the films, this initial fixed value provides an excess oxygen flow over what is required during steady state sputtering. Hence the oxygen flow will drop in this case. The gas control algorithm can then automatically adjust the oxygen gas flow to keep the total gas pressure constant. The oxygen flow control parameters are chosen to avoid oscillations in the total gas pressure. This algorithm allowed the oxygen gas flow to be adjusted automatically when the deposition power changed or if the gas pumping speed drifted slowly. Although the above process is satisfactory at low rates, it is quite inadequate at high rates.

Figure 8:
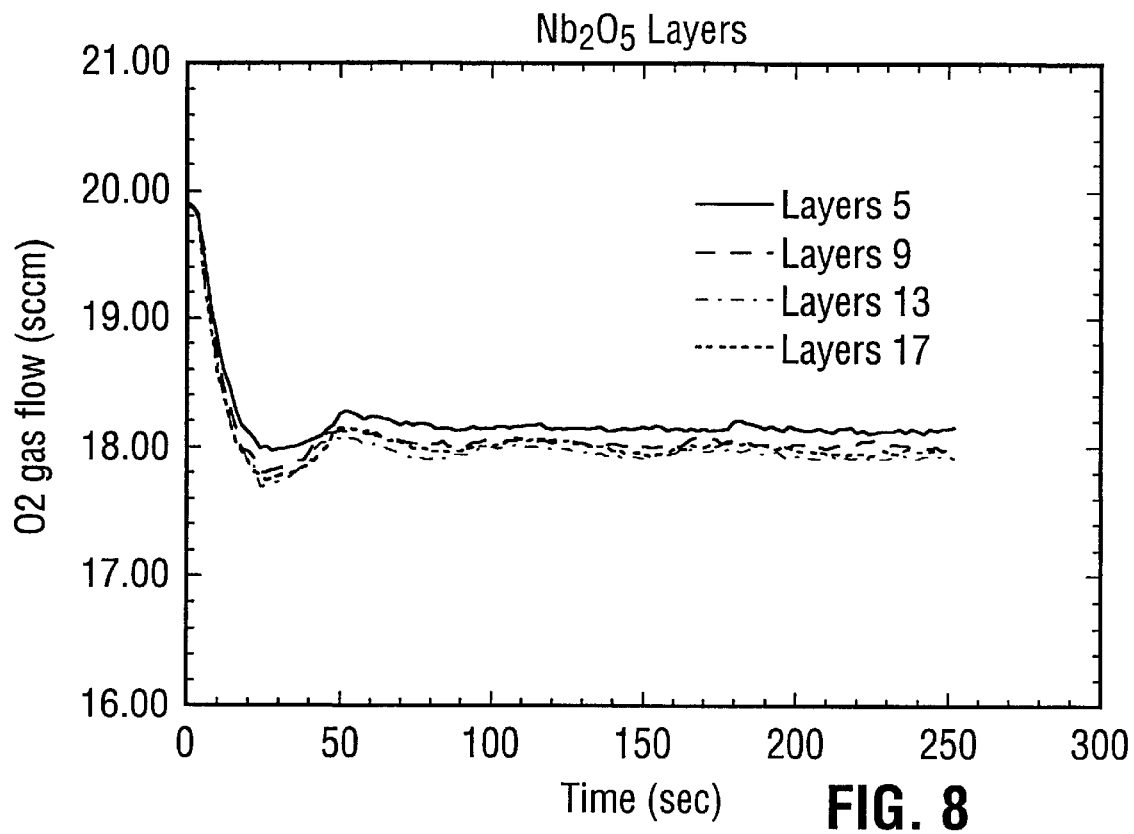
FIG. 8 shows the oxygen gas flow rate as a function of time for each layer when successive $Nb_2O_5$ layers are deposited.

FIG. 8 shows the experimentally measured oxygen flow, as a function of time, after a high constant power was applied to the niobium high-rate ac-magnetron source. The old gas control strategy was used to deposit four separate $Nb_2O_5$ layers. (In-between the $Nb_2O_5$ layers, $SiO_2$ layers were also deposited.) The same initial oxygen flow rate was used at the beginning of each layer. This rate was high enough to avoid absorption problems. The oxygen flow was then adjusted to keep the total argon and oxygen pressure constant. It can be seen that there was a significant drop in the oxygen gas flow. It is likely that a drift in the pumping speed is responsible for the different levels at which the oxygen partial pressure stabilized for the four layers.

Figure 9:
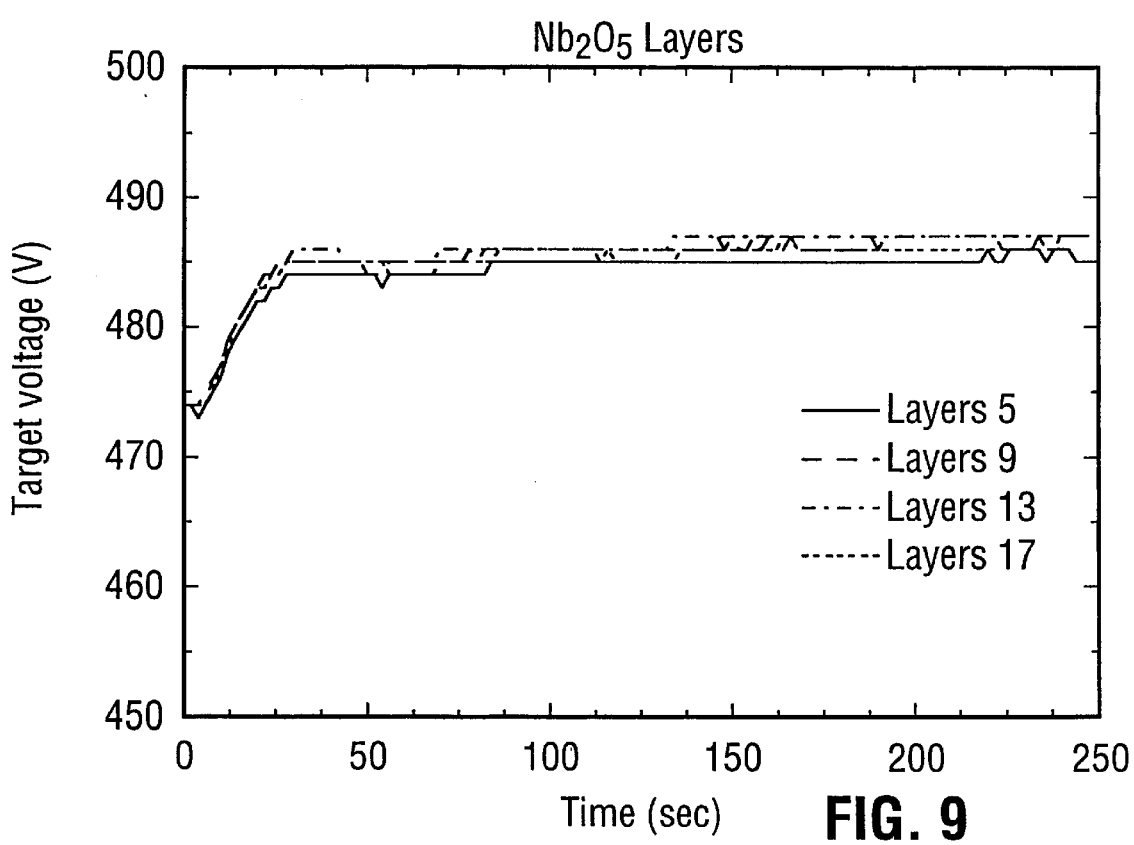
FIG. 9 shows the target voltage as a function of time for each layer when successive $Nb_2O_5$ layers are deposited.

FIG. 9 shows the corresponding niobium target voltages resulting from the variations in the oxygen flow. Target voltages are a good indication of when the deposition conditions have stabilized and hence when the refractive index of the film is constant. The agreement between these curves is better, but there is still a significant change at the beginning of each layer deposition. It is certain that the four layers had significant refractive index inhomogeneities.

Inhomogeneities in the refractive indices of the layers have a profound effect on the accuracy of the thickness control process. The key to depositing complex multilayer filters in the ADS is the accurate determination of the layer thickness based on transmittance measurements. The present thickness determination method assumes a model in which all the layers are homogenous. This model is no longer valid if there are significant inhomogeneities of refractive index in the layers. It is not practical to modify the model to take inhomogeneities into account. This would greatly complicate the analysis: a quite complex model would have to be used to allow for the fact that the extent of this inhomogeneity may vary from layer-to-layer as well as from run-to-run. Yet, if the presence of a strong inhomogeneity is ignored, after a while the thickness determination software will start to come up with incorrect thickness values. Once this happens, it becomes nearly impossible to deposit the desired filter accurately.

Figure 10:
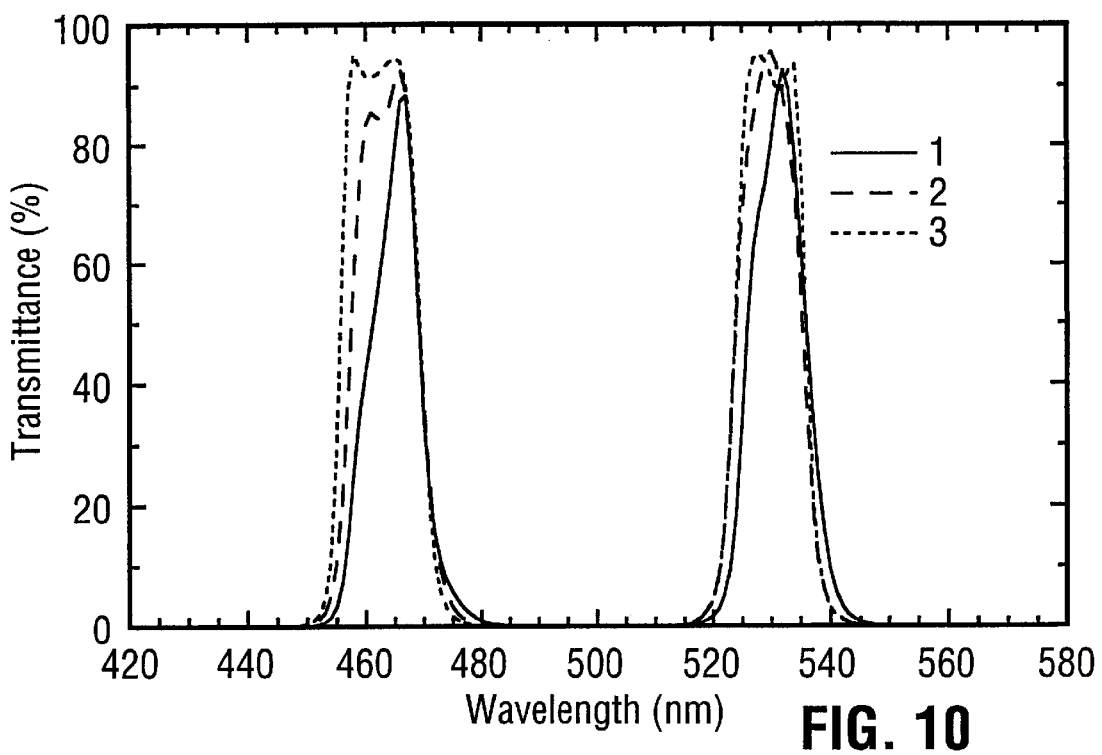
FIG. 10 shows the transmittance curves of two-peak interference filters made without setting the oxygen flow rate at the start of deposition to the value at the end of the last stage of the previous layer at the same power level.
Figure 11:
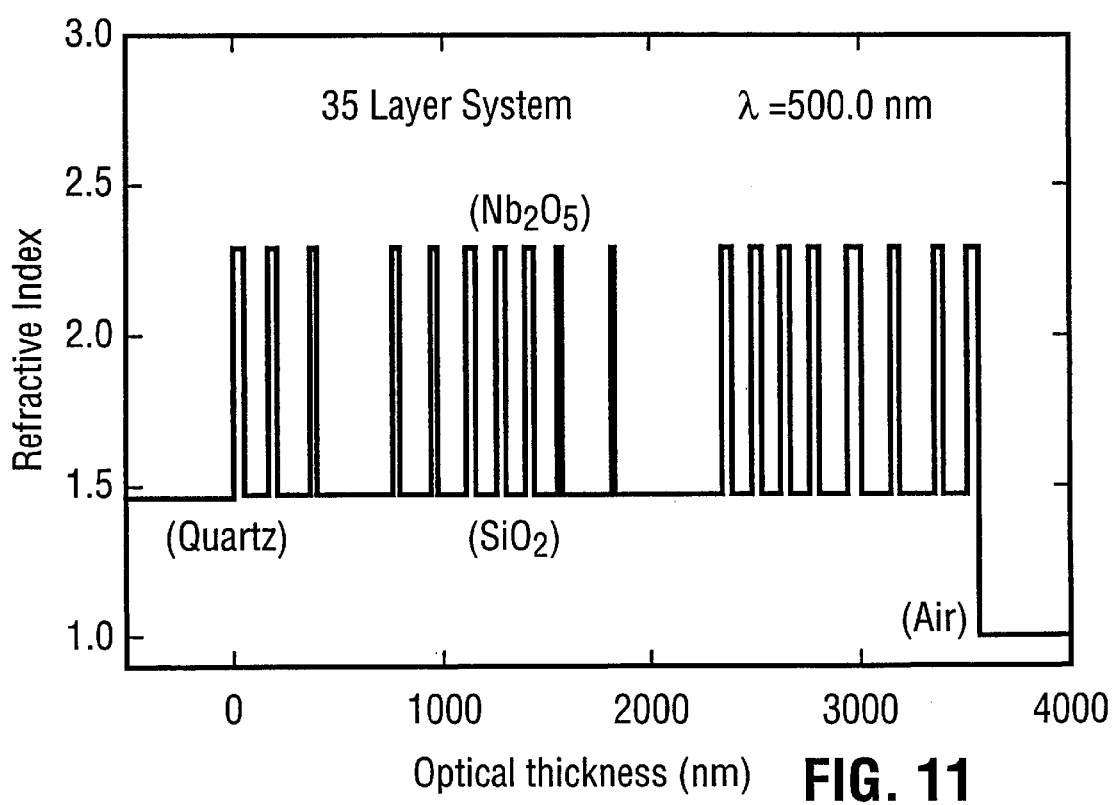
FIG. 11 shows the refractive index profile of the 35 layer two-peak interference filter of FIG. 10.

FIG. 10 shows an example of this. It shows the measured transmittance curves of three 35-layer two-peak interference filters based on $Nb_2O_5$ and $SiO_2$ and produced by high rate ac-magnetron sputtering using the process control depicted schematically in FIG. 3 with the gas control algorithm referred to above. The refractive index profile of this filter is shown in FIG. 11. The first 95–97% of the desired layer thickness were deposited at a high rate, (which is required in order for the equipment to be commercially viable), but the remaining 3–5% were deposited at a low rate to accurately obtain the desired overall layer thickness. Note the poor repeatability from run to run and that none of the filters have the square bandpass shapes that they are supposed to have. These problems can be directly attributed to thickness determination problems resulting from inhomogeneities in the refractive indices of the individual layers in the system.

An important factor in eliminating this problem is to reduce the re-stabilization time and hence the inhomogeneity in layers deposited both by low and high rate reactive sputtering. Rather than assigning the same (fixed) initial oxygen gas flow for each layer for both low and high power settings, the initial gas flow is based on the oxygen gas flow of the same target for the last layer deposited under the same power conditions. That is, if the oxygen gas flow was 10.0 sccm near the end of a $Nb_2O_5$ layer being deposited at a high rate, then the initial oxygen gas flow for the next deposition of a $Nb_2O_5$ layer at the same high rate would be assigned a value of 10.0 sccm. This results in a much quicker stabilization time and reduces the inhomogeneity present in the film.

Figure 12:
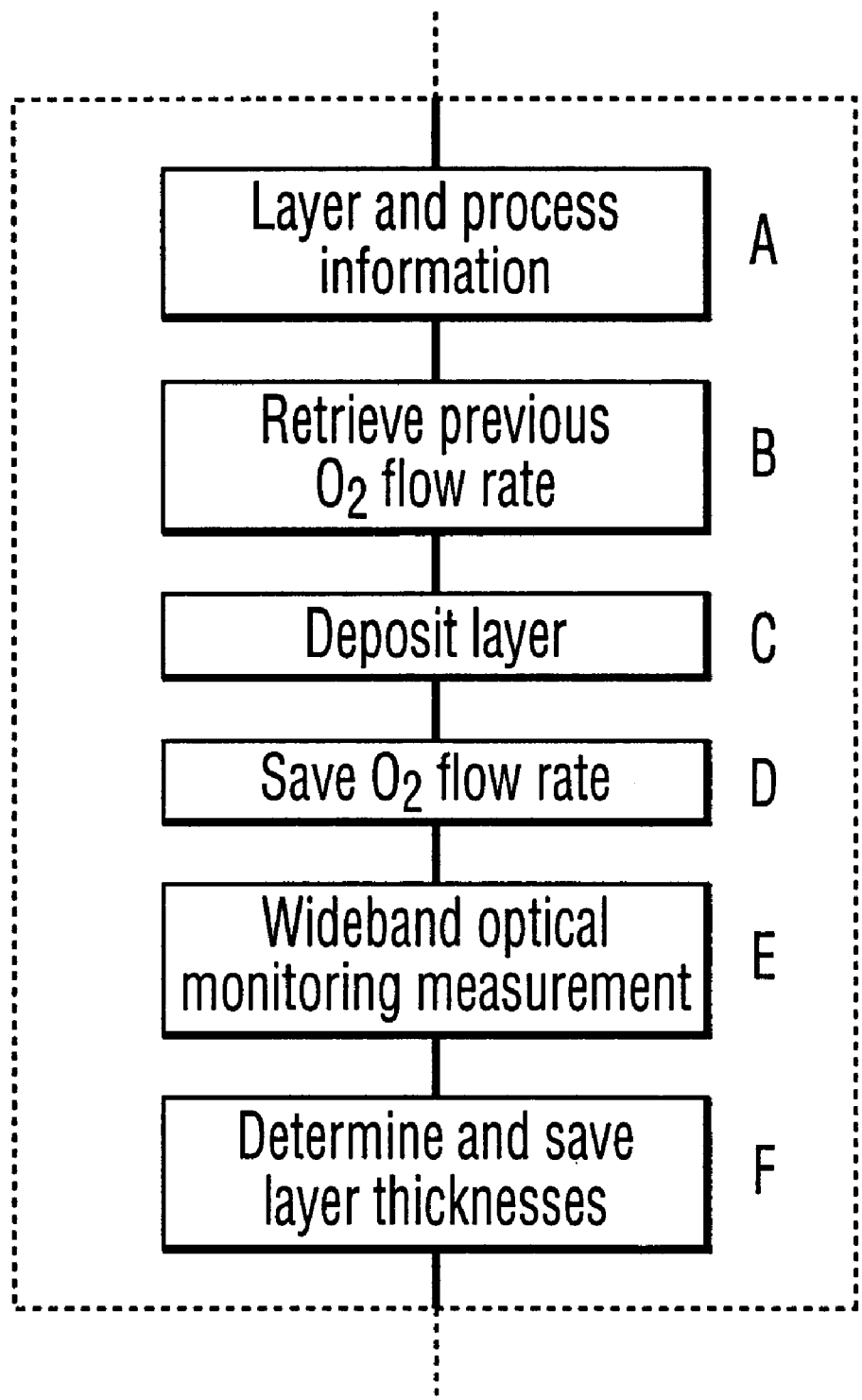
FIG. 12 is a flow chart showing a part of the two-stage deposition process in accordance with the invention suitable for use with high and low powers.

FIG. 12 is a schematic representation of this layer deposition strategy. The boxes B–E of the flow chart of the process control for reactive rf-sputter deposition process shown in FIG. 3 are replaced by the steps shown in FIG. 13. After the layer and process (high rate, low rate) information is provided (A), the process controller retrieves the oxygen flow rate that prevailed at the end of the last deposition of a layer of the same material sputtered under the same process conditions (B), namely the same power level. The layer is then deposited (C) and the oxygen flow rate, just before the layer deposition is terminated is stored for future use (D) during deposition of a subsequent layer of the same material. The transmittance of the layer system is measured with the wideband optical monitor (E) and the layer thickness is determined (F).

Figure 13:
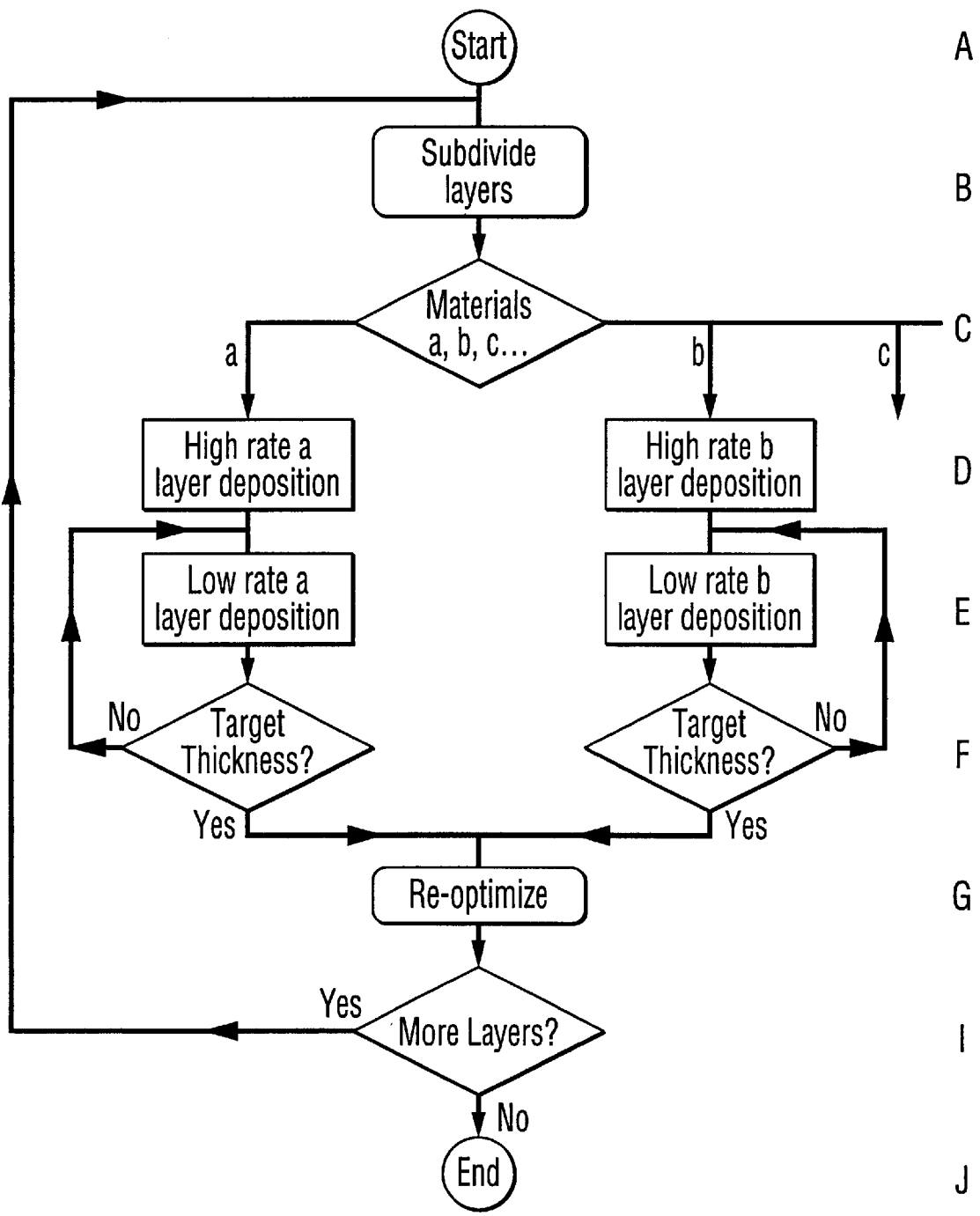
FIG. 13 is a flow chart showing the complete two-stage deposition process.

The complete flow chart incorporating the process control is shown in FIG. 13. There is a different branch for each coating material a, b, c . . . Boxes (D) and (E) correspond to high and low rate depositions, respectively. Each of these boxes consists of all the steps shown in FIG. 12; they differ only in the fact that their flow rates are different and are therefore stored and retrieved from different locations in memory 16.

Figure 14:
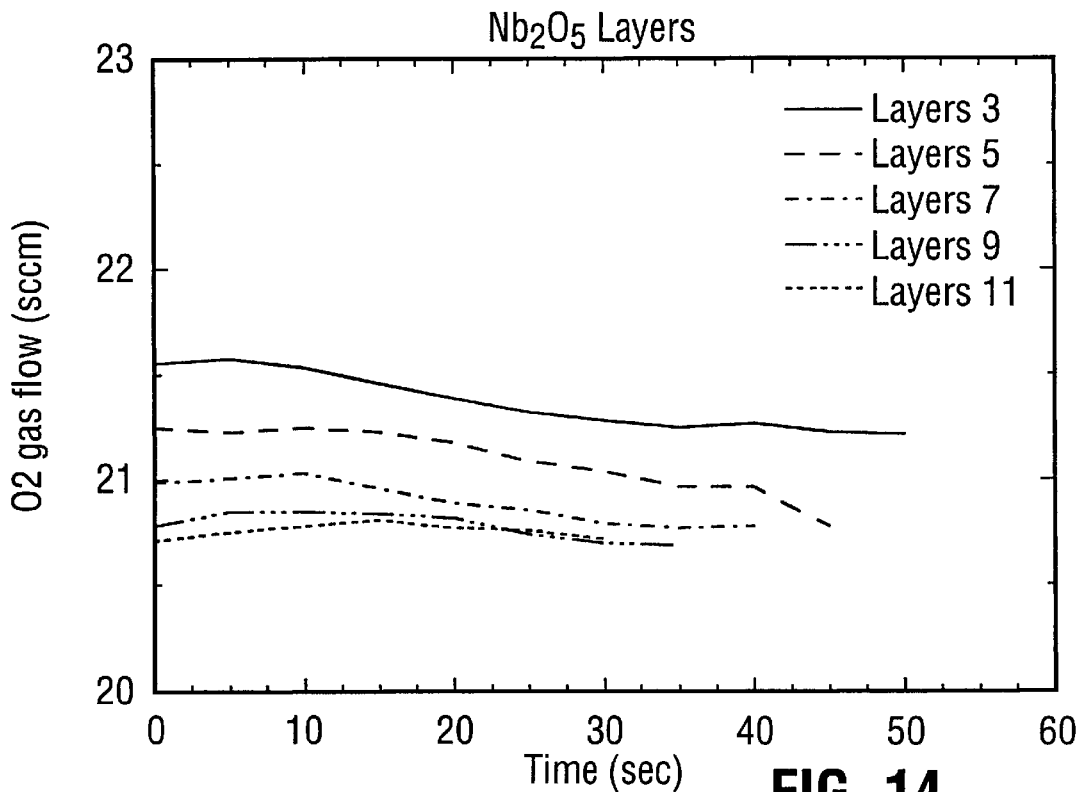
FIG. 14 shows the oxygen flow rate as a function of time for several layers deposited by setting the oxygen flow rate at the start of deposition to the value at the end of the last stage of the previous layer at the same power level.
Figure 15:
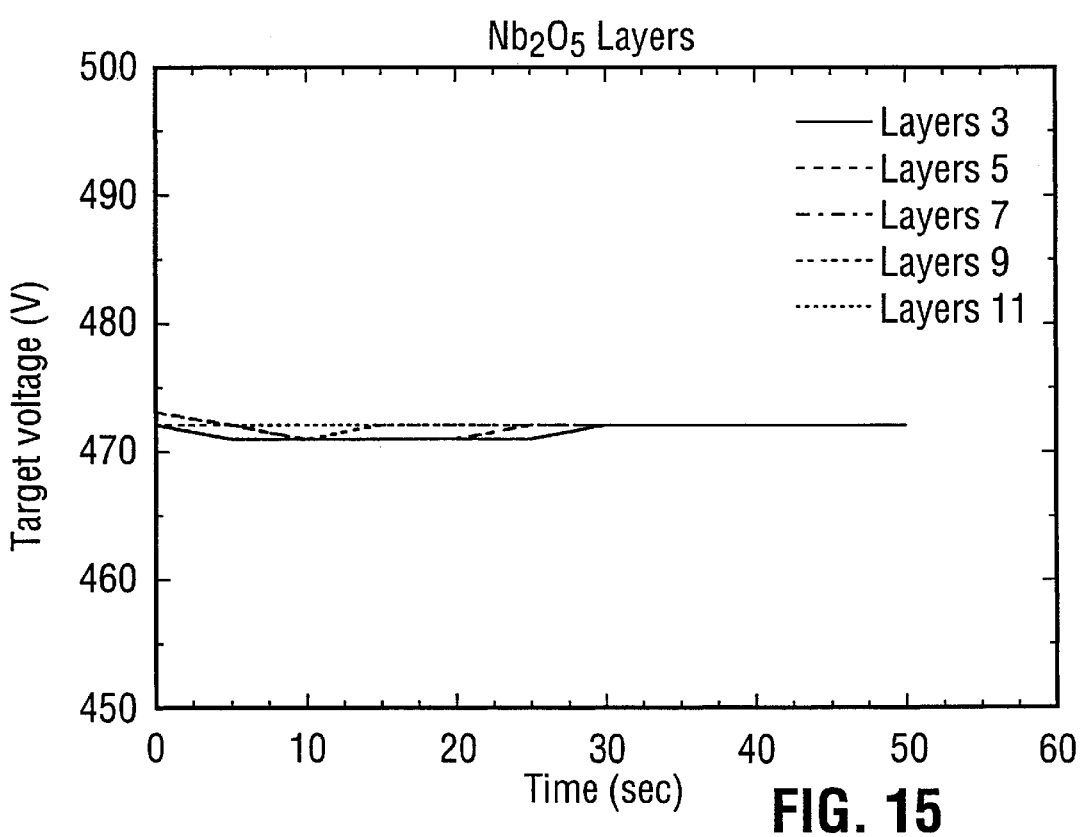
FIG. 15 shows the target voltage as a function of time for several layers for a system made in accordance with FIG. 14.

The experiments described above were repeated, except that this time the new gas process control strategy was applied. FIG. 14 shows the measured oxygen flow, plotted as a function of time, after a high constant power was applied to the ac-magnetron source during the reactive deposition of five different $Nb_2O_5$ layers. (In between the $Nb_2O_5$ layers, $SiO_2$ layers were also deposited.) This time the initial oxygen flow rate for each $Nb_2O_5$ layer deposited at high power was set equal to the value of the flow rate at the end of the deposition of the last $Nb_2O_5$ layer deposited at the same high power. Once again, the argon flow was constant and the oxygen flow was adjusted to keep the total $(Ar+O_2)$ pressure constant. It will be seen from this figure that the oxygen flow stabilized quickly with this new gas pressure control. FIG. 15 shows the experimentally measured variation of target voltage with time that resulted from the variation in oxygen flow depicted in FIG. 14. Note that the target voltage also stabilized very quickly and that it was more repeatable. Target voltages are a good indication of when the deposition conditions have stabilized and hence when the refractive index of the deposited layer is constant.

Figure 16:
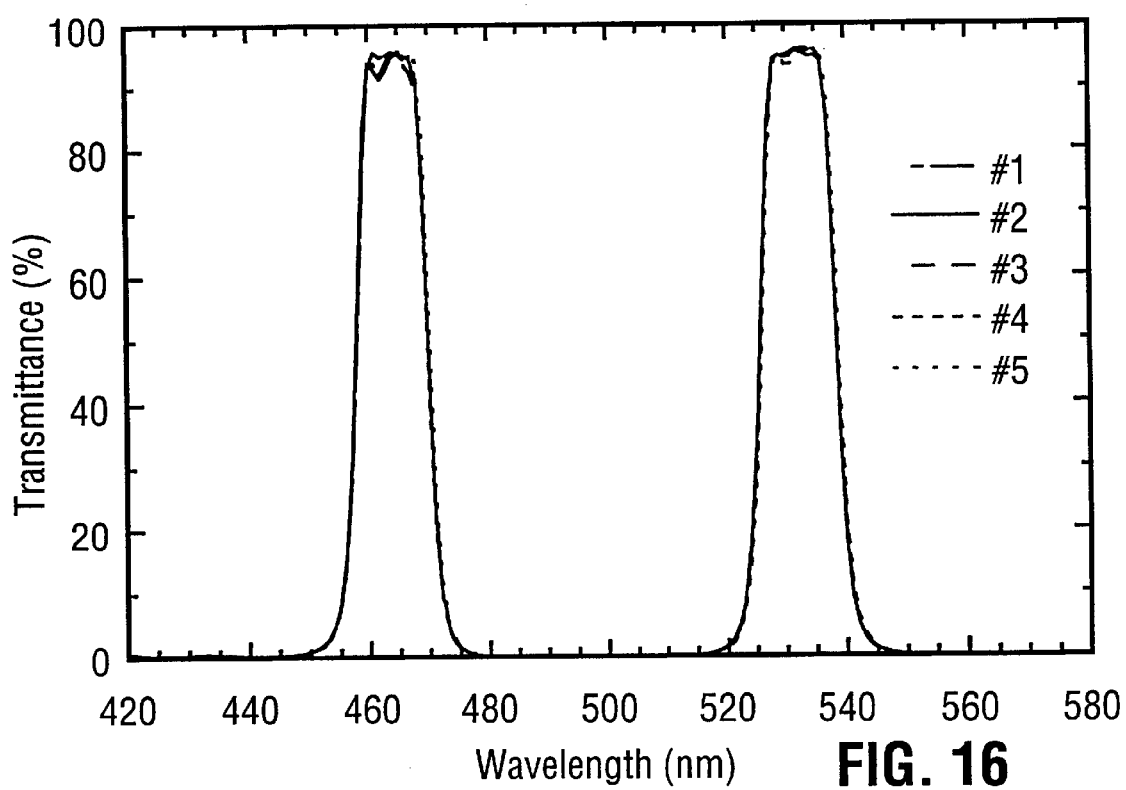
FIG. 16 shows the transmittance of a two-peak interference filter made by the inventive method.
Figure 17:
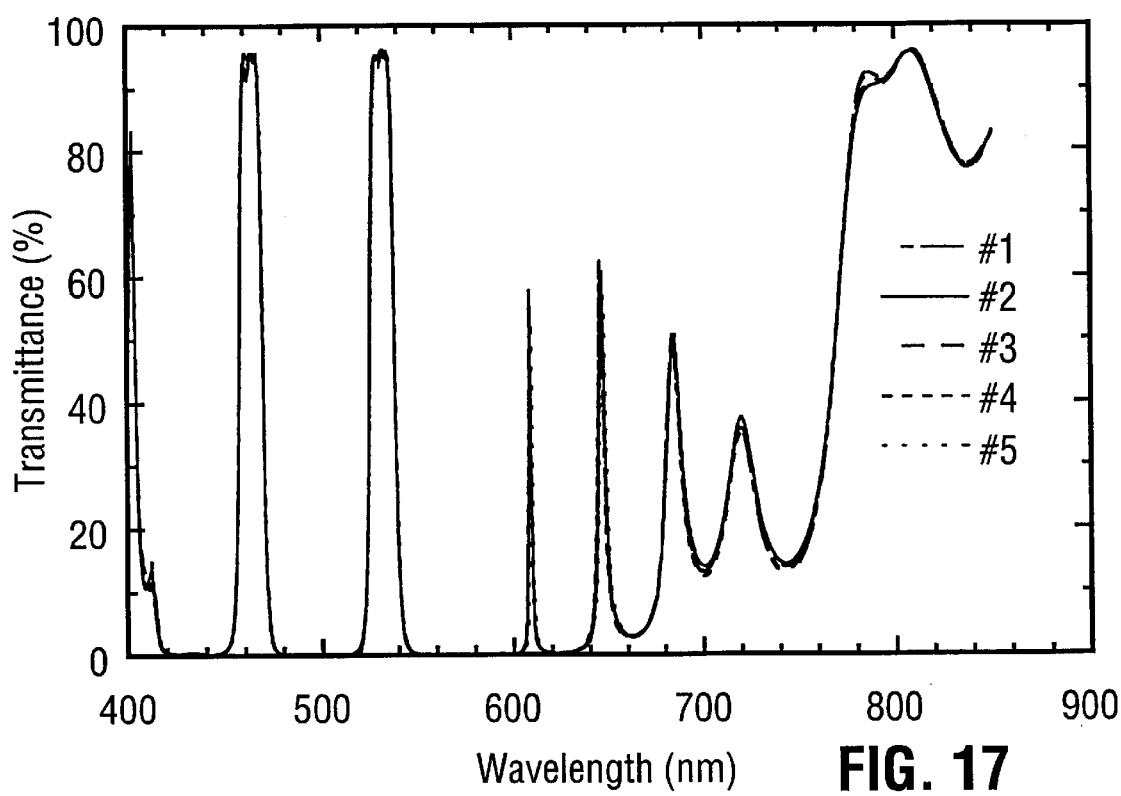
FIG. 17 shows the transmittance of the two-peak interference filter of FIG. 16 for a broader spectral region.

FIG. 16 shows the experimentally measured transmittance curves of two-peak interference filters produced in five separate deposition runs using the process control system depicted schematically in FIGS. 12 and 13. It will be seen that the filter shape is now excellent and there is a very good run-to-run reproducibility. The positions of the peaks are within 0.2 nm of the design wavelength specifications. As can be seen in FIG. 17, the repeatability is very good over a spatial range from 400 to 900 nm, even though the spectral range of interest lies only between 420 to 580 nm. Thus, the combination of the previously described ADS thickness control algorithm, the high rate ac-magnetron deposition sources and the new ADS gas process control makes possible the successful automatic deposition of complex filters in one-fifth to one-tenth of the time that it took previously. This makes the present ADS system commercially viable.

A number of materials, including $Nb_2O_5$, $SiO_2$, $Al_2O_3$ and $ZrO_2$, have been deposited on this system. In particular, the rates for $Nb_2O_5$ and $SiO_2$ were both ~0.7 nm/s. This means that filters that used to take more than 21 hours to deposit now take only ~3 hours to deposit. The thickness uniformity, for a stationary substrate, was ±1% over a 70×70 mm area and ±2.5% over a 110×140 mm area. A series of other filter designs were deposited to demonstrate that the described system has a good run-to-run repeatability to match that of the previous rf-system.

Figure 18:
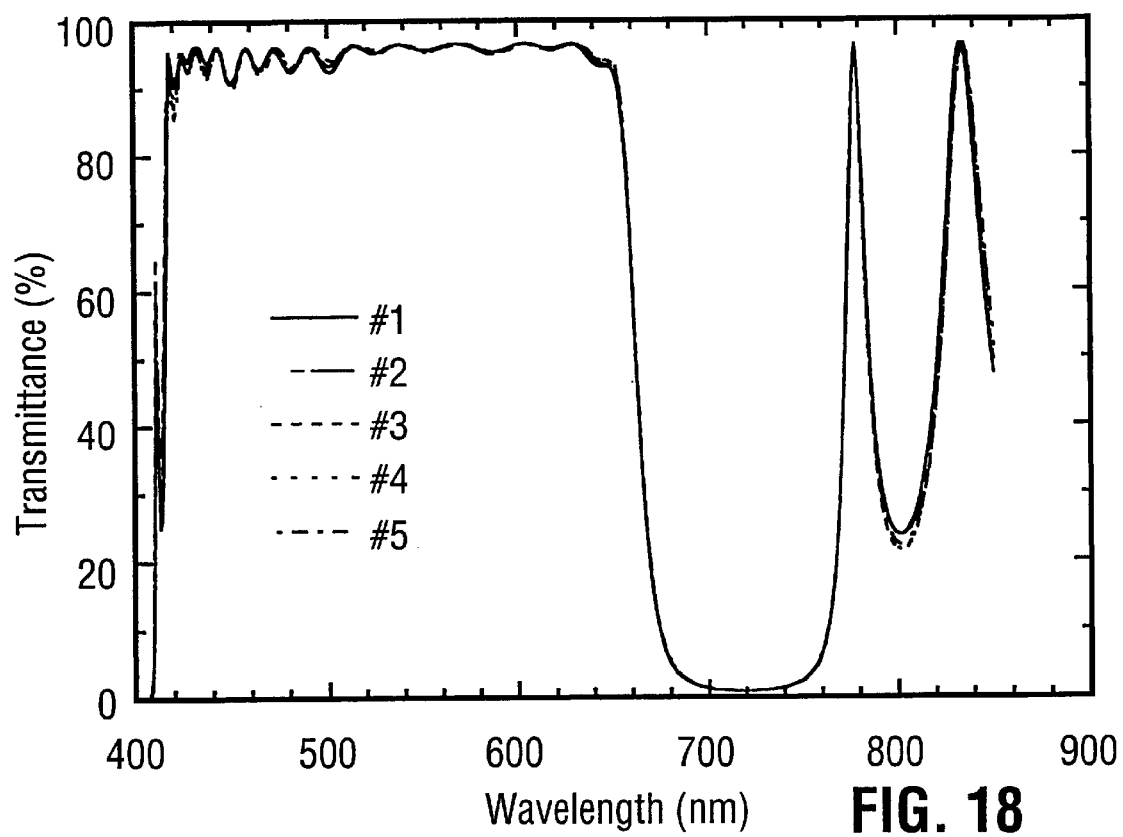
FIGS. 18 to 19 show the results of repeatability test of 5 different runs of a multilayer edge filter fabricated in accordance with the invention.
Figure 19:
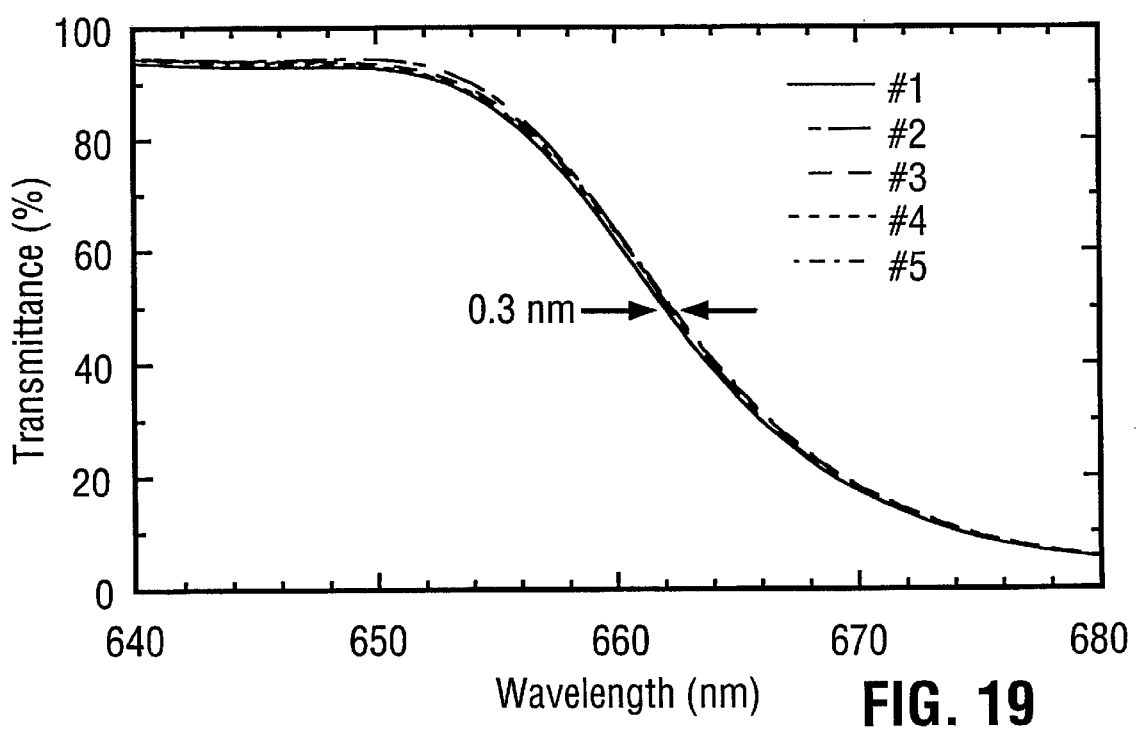
Figure 20:
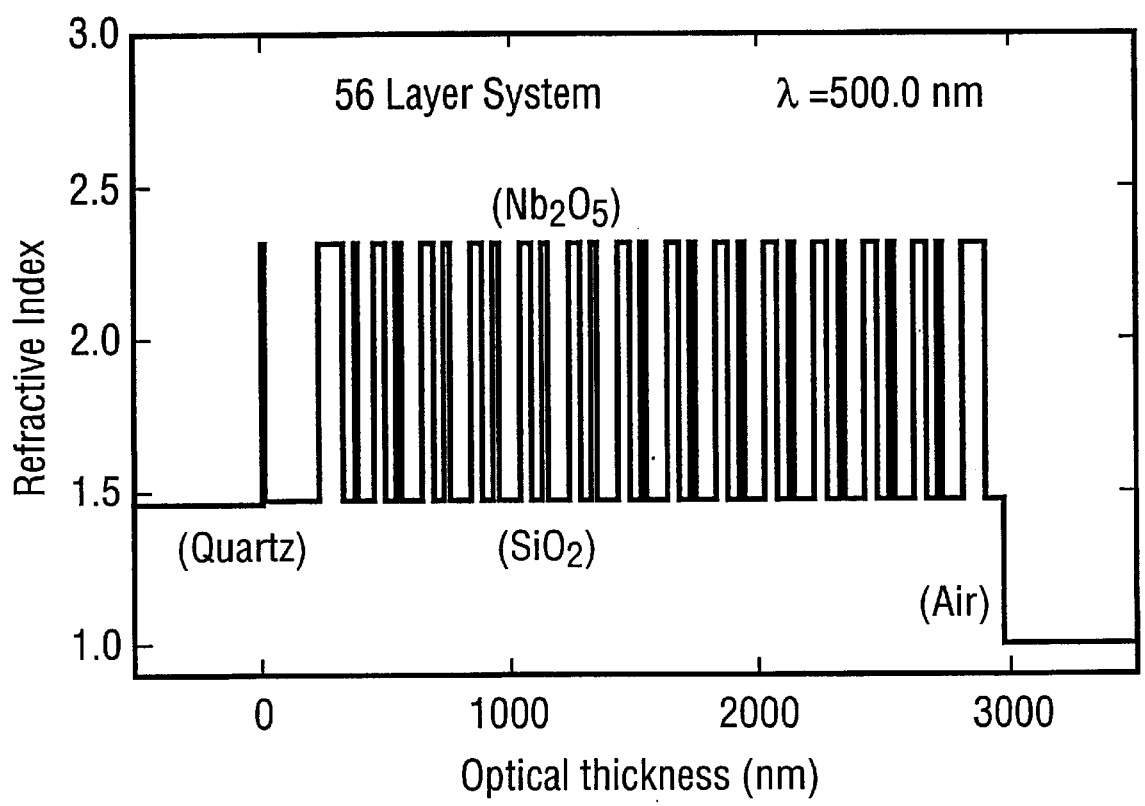
FIG. 20 shows the refractive index profile of the edge filter depicted in FIG. 18.

One such demonstration filter was an edge filter. The refractive index profile of this 58-layer coating is shown in FIG. 20. In order to accurately position the edge filter at the same wavelength, the filter was reoptimized at various stages of deposition. Five separate deposition runs were performed and the normal incidence transmittance measurements of the filters are shown in FIG. 18. It is evident from this figure that the described system has an excellent reproducibility. The precision of the ADS-I is highlighted in FIG. 19 which shows the edge wavelength does not vary by more than 0.3 nm over the five deposition runs.

The above results confirm that not only is it possible to design complex filters to meet demanding specifications, it is now possible to actually fabricate them automatically and on a routine basis. In addition, it is now possible to manufacture these coatings at high deposition rates and with good thickness uniformity. With the advances made in thin film design and manufacturing techniques, it should be feasible in the near future to have an integrated thin film design and deposition system where an operator can enter detailed filter specifications into a system which will then automatically design and manufacture the filter.

While the invention has been described in connection with sputtering, it will be understood that it can be applied to other forms of reactive deposition, such as reactive ion sputtering, reactive ion plating or ion-assisted deposition.

What is claimed is:

1. A method of sputter depositing on a substrate a complex multilayer coating consisting of multiple layers of at least two materials, said method comprising the steps of sequentially depositing said layers in a deposition chamber in the presence of a reactive gas and an inert gas so as to form accumulated deposited layers, at least an initial portion of each said layer being deposited at a high rate of above about 0.5 nm/s; deriving the thickness of the deposited layers at one or more times during the deposition of each layer by taking optical measurements over a plurality of wavelengths and fitting theoretical values for said measurements derived from a theoretical model of the accumulated deposited layers to corresponding measured values obtained from said measurements; determining whether a derived thickness of a current layer being deposited corresponds to a target thickness for said current layer, and if so proceeding with a next subsequent layer of the second of said at least two materials, otherwise continuing with the deposition of any remaining thickness at a lower rate than said high rate of said current layer, continually controlling a flow rate of said reactive gas as each deposited layer is formed to strive to stabilize partial pressure of said reactive gas at a constant value to maintain stoichiometry and thereby ensure substantial homogeneity in reactive index in a thickness dimension throughout the whole of each deposited layer of the same material so that a valid thickness determination can be made from said theoretical model; saving the flow rate of said reactive gas at the end of high rate deposition for each deposition step as a saved final value; and for each subsequent deposited layer of each material setting the initial flow rate of the reactive gas at the saved final value of the flow rate at the end of high rate deposition for the previous layer deposited of the same material so as to reduce restabilization time for each said subsequent deposited layer.

2. A method as claimed in claim 1, wherein said optical measurements are transmittance measurements.

3. A method as claimed in claim 1, wherein the flow rate of said inert gas is constant and the flow rate of said reactive gas is controlled to maintain the total pressure substantially constant as deposition of each layer proceeds.

4. A method as claimed in claim 2, wherein said reactive gas component is oxygen.

5. A method as claimed in claim 1, wherein at least one of said materials is $Nb_2O_5$.

6. A method as claimed in claim 1, wherein at least one of said materials is $SiO_2$.

* * * * *